United States Patent
Yamaguchi et al.

(10) Patent No.: US 6,597,192 B2
(45) Date of Patent: *Jul. 22, 2003

(54) TEST METHOD OF SEMICONDUCTOR DEVICE

(75) Inventors: Miho Yamaguchi, Ibaraki (JP); Yuji Hotta, Ibaraki (JP)

(73) Assignee: Nitto Denko Corporation, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/494,379

(22) Filed: Jan. 31, 2000

(65) Prior Publication Data

US 2003/0080768 A1 May 1, 2003

(30) Foreign Application Priority Data

Jan. 29, 1999 (JP) ............................. 11-023128

(51) Int. Cl.$^7$ .......................... G01R 31/26; G01R 31/02
(52) U.S. Cl. ........................ 324/765; 324/755; 324/754
(58) Field of Search ............................. 324/754, 755, 324/765

(56) References Cited

U.S. PATENT DOCUMENTS

| | | | |
|---|---|---|---|
| 5,831,441 A | * 11/1988 | Motooka et al. | 324/754 |
| 4,924,589 A | * 5/1990 | Leedy | 29/832 |
| 5,323,108 A | * 6/1994 | Mark, III et al. | 324/158.1 |
| 5,477,160 A | * 12/1995 | Love | 324/755 |
| 5,716,218 A | 2/1998 | Farnworth et al. | |
| 5,821,762 A | * 10/1998 | Hamaguchi et al. | 324/754 |
| 5,944,093 A | * 8/1999 | Viswanath | 324/760 |
| 5,986,342 A | * 11/1999 | Uchiyama et al. | 257/758 |
| 6,046,598 A | * 4/2000 | Miyaji et al. | 324/754 |
| 6,049,217 A | * 4/2000 | Viswanath | 324/760 |
| 6,133,637 A | * 10/2000 | Hikita et al. | 257/777 |
| 6,154,038 A | * 11/2000 | Ito et al. | 324/752 |
| 6,245,175 B1 | * 6/2001 | Hotta et al. | 439/66 |

FOREIGN PATENT DOCUMENTS

| | | | |
|---|---|---|---|
| EP | WO 91/12706 | 8/1991 | |
| JP | A-61-292866 | 12/1986 | |
| JP | 2000286293 A | * 10/2000 | ............ H01I/21/60 |

OTHER PUBLICATIONS

XP 000281295 "High Density Probe Assembly", 2244 Research Disclosure (1992).

* cited by examiner

*Primary Examiner*—Kamand Cuneo
*Assistant Examiner*—Jermele Hollington
(74) *Attorney, Agent, or Firm*—Sughrue Mion, PLLC

(57) ABSTRACT

A semiconductor device is tested for its function by sandwiching the inventive anisotropic conductive film 1 between a semiconductor device 2 and a circuit board 3, and applying a contact load F of 3–50 gf per one electrode of the device to achieve functionally testable conduction between the device 2 and the board 3. The anisotropic conductive film 1 has a structure wherein plural conductive paths having a total length of 60–500 $\mu$m protrude from the both surfaces of the film substrate made of an insulating resin, and shows an elastic modulus of 0.1–1.0 GPa at 25–150° C. The deformation of the anisotropic conductive film during a test is 5–30 $\mu$m.

6 Claims, 3 Drawing Sheets

TEST METHOD OF SEMICONDUCTOR DEVICE

TECHNICAL FIELD OF THE INVENTION

The present invention relates to an anisotropic conductive film. More particularly, the present invention relates to an anisotropic conductive film used to secure continuity of a semiconductor device during a functional test of the device, and to a test method for a semiconductor device using the film.

BACKGROUND OF THE INVENTION

In recent years, further integration of integrated circuits has resulted in increased numbers of electrodes carried on a bear chip semiconductor device, which means the arrangement patterns thereof have become fine at narrower pitch. This in turn has resulted in increased costs for fabricating the device as well as a circuit board for mounting the device due to finer wiring patterns. A functional test of a semiconductor device, therefore, should be done before mounting the device on a circuit board. Otherwise, the device judged defective after mounting is discarded together with the good circuit board, thereby lowering the production efficiency of the circuit board while increasing an economical loss. The same applies to the case where the other one is defective.

For functional testing of a semiconductor device, therefore, it is desirable to run various functional tests prior to mounting the device on a circuit board. One of the methods therefor includes bringing a semiconductor device into contact with a circuit board via an anisotropic conductive film at the same position as in actual mounting, and running a functional test of the device.

The present inventors have closely examined the contact state during the test and found that bare chip semiconductor devices have warp, and the circuit boards have warp and waviness. As a result, many electrodes in one device fail to make an appropriate contact with the conductor part of the circuit board, which impairs the reliability of the test. To solve this problem, the contact load (pressure) may be increased. However, even if all the electrodes in the device and the conductor parts of the circuit board are connected, bump contacts formed on the electrodes of the device are deformed by the test itself.

When the semiconductor device that passed the test is mounted on a circuit board, therefore, the deformed bump contacts now cause a connection failure.

It is therefore an object of the present invention to solve the above-mentioned problems and provide a test method that enables a functional test with high connection reliability by applying a low contact load, even in the case of a semiconductor device having narrow pitch electrodes, as well as an anisotropic conductive film to be used therefor.

SUMMARY OF THE INVENTION

The present invention provides the following.

(1) A method for a functional test of a semiconductor device, comprising the steps of
  (a) sandwiching an anisotropic conductive film between a semiconductor device and a circuit board and
  (b) applying a contact load of 3–50 gf per one electrode of the device to achieve functionally testable conduction between the device and the board, the anisotropic conductive film comprising a film substrate made of an insulating resin and plural conductive paths having a total length of 60–500 $\mu$m and made of a conductive material, and having a structure wherein the plural conductive paths penetrate the film substrate in the thickness direction and protrude from the both surfaces of the film substrate, which paths being insulated from each other, wherein the film as a whole has an elastic modulus of 0.1–1.0 GPa at 25–150° C.

(2) The method of the above-mentioned (1), wherein the anisotropic conductive film deforms by 5–30 $\mu$m due to the contact load.

(3) The method of the above-mentioned (1), wherein at least the conductive paths in the film substrate are metal conductor wires having a diameter of 5–30 $\mu$m and the protrusion is either the metal conductor wire itself or a metal precipitated on an end of the metal conductor wire.

(4) An anisotropic conductive film for a functional test of a semiconductor device, which comprises a film substrate made of an insulating resin and plural conductive paths having a total length of 60–500 $\mu$m and made of a conductive material, and which has a structure wherein the plural conductive paths penetrate the film substrate in the thickness direction and protrude from the both surfaces of the film substrate, which paths being insulated from each other, wherein the film as a whole has an elastic modulus of 0.1–1.0 GPa at 25–150° C.

(5) The film of the above-mentioned (4), wherein at least the conductive paths in the film substrate are metal conductor wires having a diameter of 5–30 $\mu$m and the protrusion is either the metal conductor wire itself or a metal precipitated on an end of the metal conductor wire.

(6) The film of the above-mentioned (4), wherein at least the conductive paths in the film substrate are covered with a layer made of a resin material other than the resin material of the film substrate.

BRIEF DESCRIPTION OF THE DRAWINGS

FIGS. 2(a) and 2(b) show one embodiment of the anisotropic conductive film to be used in the present invention, wherein FIG. 2(a) shows the film plane partially enlarged to show the arrangement pattern of the conductive paths and FIG. 2(b) shows a cross section along the line 2b—2b of FIG. 2(a).

DETAILED DESCRIPTION OF THE INVENTION

Figure 1:
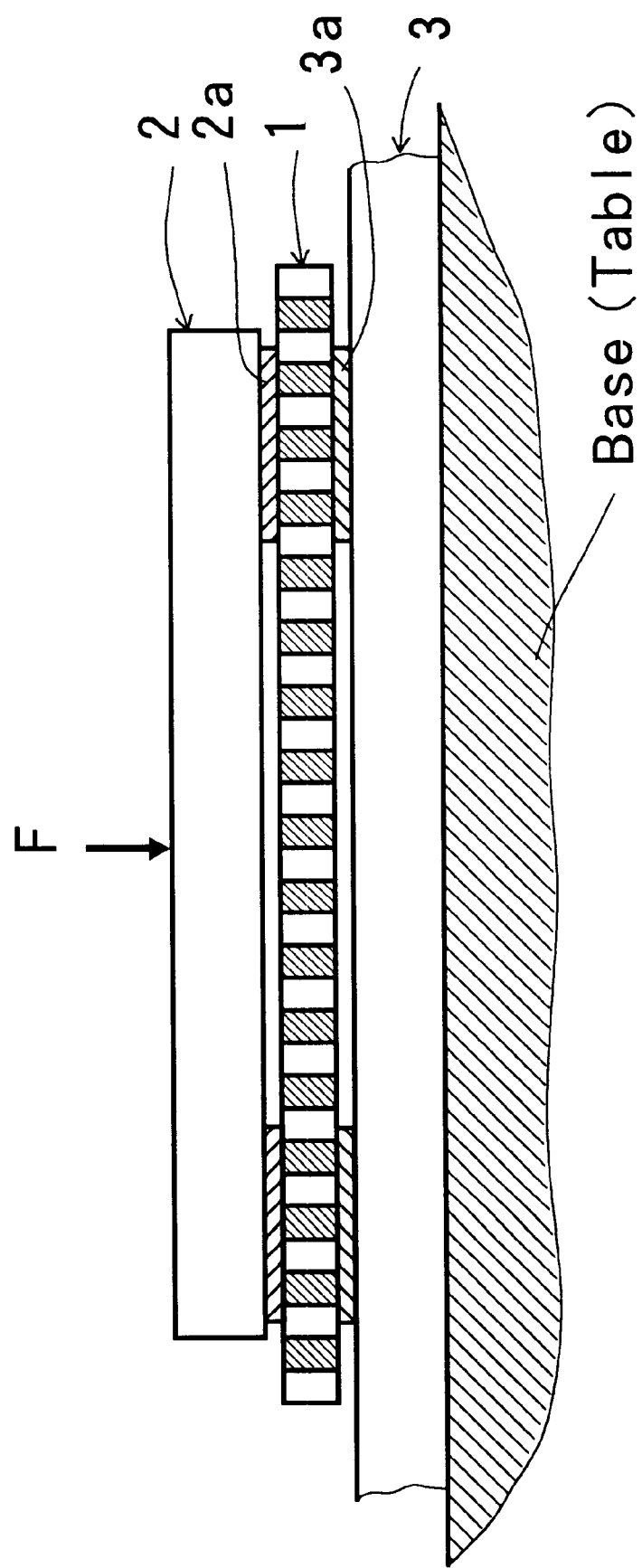
FIG. 1 is a sectional view showing the testing of a semiconductor device according to the inventive test method, wherein each part is larger than in reality for easy understanding, and the hatching is used for clear distinction of each part.

As shown in FIG. 1, according to the test method of the present invention, an anisotropic conductive film (hereinafter to be also referred to as "ACF") 1 is sandwiched between a semiconductor device 2 and a circuit board 3, and a contact load F is applied thereon to achieve functionally testable conduction between the device 2 and the board 3. What is critical here is that (1) the film to be mentioned later should be used as ACF 1, and that (2) the functional test of a semiconductor device should be performed while setting the contact load per one electrode of the semiconductor device to 3–50 gf. Under these conditions, warp and waviness in the semiconductor device or circuit board are absorbed by the deformation of ACF itself, whereby an electrodes 2a of the semiconductor device and the corresponding conductor part 3a on the circuit board 3 are brought into normal contact by the application of the least load.

The circuit board may be a product to mount a device or a model prepared for the test.

The contact load should be within the range free from damaging the electrodes of a semiconductor device and achieve the lowest contact resistance. The electrodes to be subjected to the functional test may be a flat pad, a solder bump or other form and the contact load is preferably 3–50 gf, particularly 5–15 gf, per single electrode. When the contact load is less than 3 gf, the connection becomes less certain (continuity does not reach 100%). When it exceeds 50 gf, the electrode deforms during a test to cause connection failure upon mounting. In particular, when a protrusion-like electrode is used, such as a solder bump, a solder ball and the like having a protrusion height of approximately 20 μm–200 μm, the effect of the above-mentioned range of contact load becomes most noticeable.

The contact load per single electrode of a semiconductor device when, for example, a flip chip bonder is used, can be obtained by dividing the total load by the number of electrodes brought into contact therewith.

The contact load compresses ACF in the thickness direction. It is preferable to test the device for its function when the amount of deformation from the original thickness becomes 5–30 μm, thereby to allow absorption of warp and waviness of the device or circuit board. The amount of deformation of ACF during a test can be directly measured. Alternatively, the elastic modulus of ACF is measured in advance and used for calculation using the contact load during the test.

To achieve a contact load of 3–50 gf per one electrode of a semiconductor device and the amount of deformation of ACF of 5–30 μm, the elastic modulus of the entire structure of ACF should be set to 0.1–1.0 GPa (gigapascal) throughout the temperature range during the test of 25° C.–150° C. Particularly, 0.1–0.4 GPa is preferable. When the elastic modulus is less than 0.1 GPa, even a small contact load produces strong adhesion, and in this case, the circuit board needs to be destroyed to save a good device. When it exceeds 1.0 GPa, waviness of circuit board and warp of chip cannot be absorbed and cause connection failure with a small contact load.

As shown in FIG. 2(a) and 2(b), ACF of the present invention comprises a number of conductive paths 11 made of a conductive material packed densely in a film substrate 10 made of an insulating resin. The conductive paths have a total length of 60 μm–500 μm and the adjacent conductive paths are each insulated from the other. Each conductive path penetrates the film substrate in the thickness direction and both ends of the conductive path protrude from the film substrate. The ACF has an elastic modulus of 0.1–1.0 GPa at 25–150° C. The use of this film makes the test method of the present invention practical.

The ACF of the present invention has a thickness equivalent to the length of a conductive path, which is 60 μm–500 μm, practically preferably about 60 μm–200 μm. The thickness of a film substrate 10 is about 30 μm–350 μm, particularly preferably about 30 μm–150 μm. The height of protrusion of a conductive path from a film substrate is about 10 μm–80 μm, particularly about 10 μm–50 μm.

The insulating resin constituting the film substrate is exemplified by thermosetting resin, thermoplastic resin and the like. For example, thermoplastic polyimide resin, epoxy resin, polyetherimide resin, polyamide resin, phenoxy resin, acrylic resin, polycarbodiimide resin, fluorocarbon resin, polyester resin, polyurethane resin, polyamideimide resin and the like can be used according to the object. Preferably, a thermoplastic resin is used. These resins may be used alone or in combination.

Figure 2:
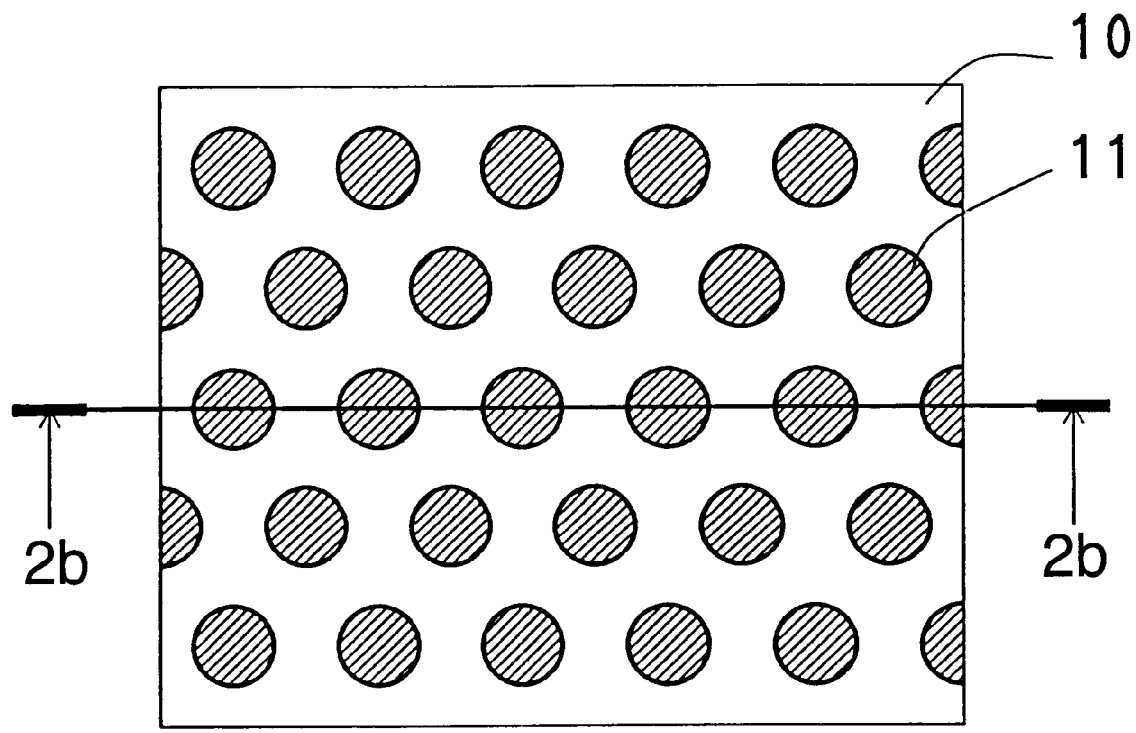
Figure 2:
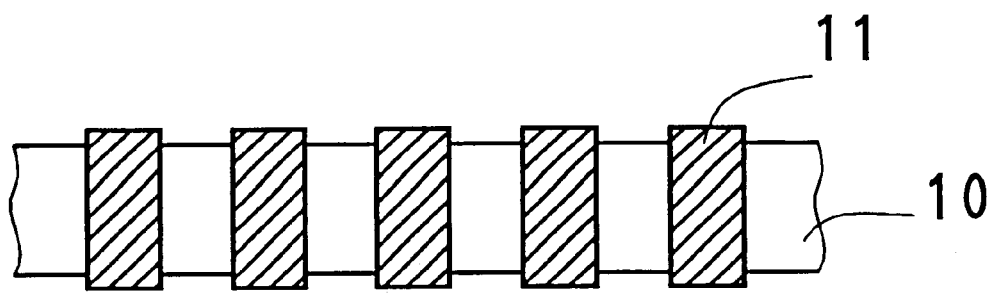
Figure 3:
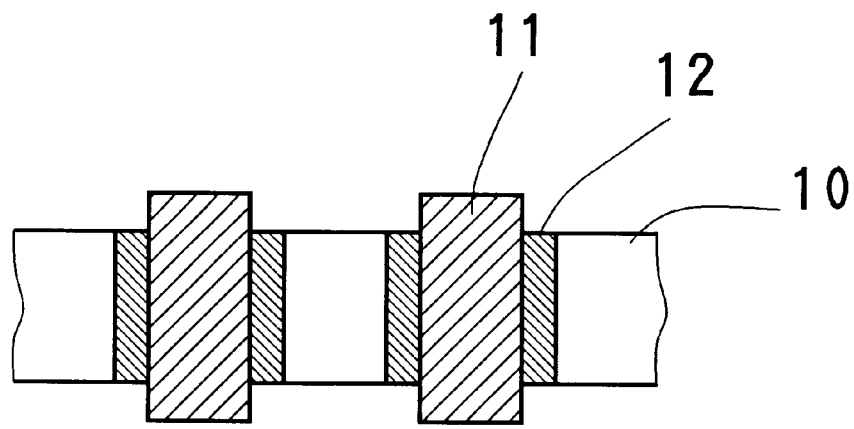
FIG. 3 is a schematic showing of another embodiment of the anisotropic conductive film to be used in the present invention.

As shown in FIG. 3 in connection with the embodiment shown in FIG. 2, a layer 12 made of a different material may be formed between the resin material of the film substrate 10 and the conductive path 11. This layer may have a multi-layer structure and may be made of any material appropriate to achieve a desired object of use and insulating property, conductivity and the like. For example, in FIG. 3, a material highly adhesive to the resin material of the film substrate 10 may be used and a material having high heat resistance and high insulating property may be used for the layer 12 surrounding the conductive path 11.

The conductive path may be made of a known conductive material. From the aspect of electrical property, preferred are metals such as copper, gold, aluminum, nickel and the like, and from the aspect of conductivity, preferred are copper and gold. The both ends protruding from the film surface may be further coated with a metal having high conductivity or high corrosion resistance, such as gold, nickel and the like.

The shape and size of the section (the plane perpendicularly cut relative to the direction of the conductive path) can be appropriately determined to meet the use of ACF of the present invention. It is preferably 5 μm–30 μm in outer diameter to deal with a fine pitch (not more than 50 μm) electrode arrangement. As long as the above-mentioned range is satisfied, the shape of the section of the conductive path may be any, such as circle, polygon and the like. One electrode of a semiconductor device is preferably connected to one to three or so conductive paths.

Figure 4:
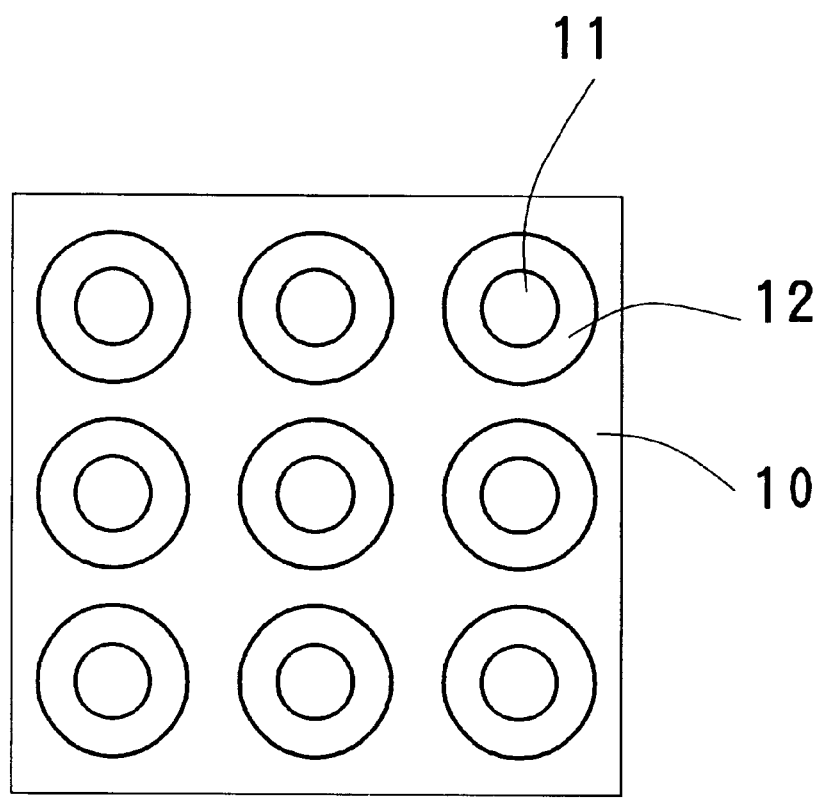
FIG. 4 shows one embodiment of the arrangement pattern of the conductive paths of the anisotropic conductive film, wherein, like FIG. 2(a), a partially enlarged film plane is shown, but the outer periphery of the film is not shown.

The conductive paths are preferably arranged densely in a film substrate. The conductive paths when seen from the film plane preferably show a pattern as shown in FIG. 4 (a square), a densely-packed pattern as shown in FIG. 2(a), or other random patterns, with preference given to a highly dense pattern to deal with fine electrodes.

The factors that determine the elastic modulus of the structure as a whole of ACF are the material of conductive path, section and total length of conductive path, density and arrangement pattern in film substrate, size of protrusion from film substrate, material of film substrate, thickness of film substrate and the like. These factors are appropriately determined to achieve an elastic modulus of the ACF structure as a whole of 0.1–1.0 GPa at 25–150° C.

Such elastic modulus can be measured by a dynamic viscoelasticity measuring machine. The measurement conditions are: elongation in one direction of expansion of the film plane of ACF, constant wavelength, and 25° C. and 150° C. The thickness of the sample equals the length of the conductive path (=thickness of entire ACF).

The materials as exemplified above of the conductive path may show variation in the properties of conductivity, elastic modulus and the like for a single metal material, depending on how the conductive path is formed. The conductive path may be formed by plating a metal material in a through hole formed in a film substrate. The most preferable mode of formation in the present invention is penetrating a metal wire through a film substrate to give a conductive path. A metal conductor wire prepared to conduct electricity, such as a copper wire defined in JIS C 3103, is preferable, because it provides a conductive path most superior in electric property, mechanical property, and cost.

The above-mentioned metal conductor wires penetrating a film substrate can be obtained by fixing a number of insulating wires bundled densely in an inseparable manner and slicing the wires into a desired film thickness in the direction forming an angle with the insulating wires. The ACF of the present invention is most desirably prepared according to a production process including the following steps (1) to (4) or steps (1) to (3) and (5).

(1) Step wherein a metal conductor wire having a diameter of 5–30 $\mu$m is coated with an insulating resin to form one or more insulating layers to give an insulating wire, and wound around a core to give a coil.

(2) Step wherein the above-mentioned coil is heated and/or pressed to integrally weld and/or compression-bond the coating layers of the insulating wires to give a coil block.

(3) Step wherein the above-mentioned coil block is sliced in a desired thickness in the direction forming an angle with the insulating wires to give a film.

(4) Step wherein the above-mentioned film is etched at the insulating resin to allow exposure of the metal conductor wire from the film plane.

(5) Step to deposit a metal on an exposed end of the metal conductor wire to form a protrusion from the film plane.

The above-mentioned steps (1) to (3) enable the most efficient dense bundling of the insulating wires and easily produce the most dense collective pattern of the conductive paths, as shown in FIG. 2(a). After the above-mentioned steps (1) to (3), the above-mentioned step (4) or (5) may be added depending on the process of protruding a conductive path.

According to the above-mentioned production process, it is also possible to form plural layers of a material on the surface of a metal conductor wire according to a desired use, such as for insulation, adhesion and the like. The ACF thus obtained shows variation in various electrical properties and mechanical properties, such as conductivity, dielectric property, insulating property, adhesiveness, strength and the like, in the direction of expansion of the film plane.

In the above-mentioned production process, the outer diameter of the metal conductor wire to be used in step (1) is preferably 5–30 $\mu$m for the functional test of a semiconductor device. Reference may be made to WO98/07216 entitled "Anisotropic conductive film and process thereof" for each step of (1) to (5) of the above-mentioned production process.

The present invention is explained in more detail in the following by way of Examples, to which the present invention is not limited.

In this example, the following sample 1 and sample 2 were prepared as ACF of the present invention by the production process including the steps (1) to (4) mentioned above and the following sample 3 and sample 4 for comparison. Using these samples, the method of the present invention was applied to examine the contact state and the like for judgement of the reliability of the test method.

Sample 1

The ACF has a structure wherein a copper wire having a diameter of 18 $\mu$m penetrates a film substrate made of a polycarbodiimide resin to form a conductive path.

The thickness of the film substrate was 50 $\mu$m, and the height of the copper wire protruding from each side of the film was 20 $\mu$m. The protrusion was gold plated in a thickness of 0.2 $\mu$m. Thus, the total length of each conductive path was about 90 $\mu$m (=thickness of ACF). The conductive paths were most densely packed as shown in FIG. 2(a) and the distance from one conductive path to the adjoining one as measured from the center line was 36 $\mu$m.

The insulating wire used for winding in the above-mentioned step (1) was obtained by coating a polycarbodiimide resin on a 18 $\mu$m diameter copper wire. The elastic modulus of the structure as a whole of this ACF was 0.9 GPa.

Sample 2

The basic structure, material, and production process were the same as in Sample 1. The conductive path had a diameter of 30 $\mu$m, the thickness of the film substrate was 50 $\mu$m, and the height of the copper wire protruding from each side of the film was 10 $\mu$m. The protrusion was gold plated in a thickness of 0.2 $\mu$m. Thus, the total length of each conductive path was about 70 $\mu$m (=thickness of ACF). The distance from one conductive path to the adjoining one as measured from the center line was 60 $\mu$m. The elastic modulus of the structure as a whole of this ACF was 0.5 GPa.

Sample 3 for Comparison

The basic structure, material, and production process were the same as in Sample 1. The total length of each conductive path was 50 $\mu$m (=thickness of ACF) and the elastic modulus of the structure as a whole of this ACF was 0.05 GPa at 150° C., which were outside the range of ACF to be used in the present invention.

The conductive path had a diameter of 18 $\mu$m, the thickness of the film substrate was 30 $\mu$m, and the height of the copper wire protruding from each side of the film was 10 $\mu$m. The protrusion was gold plated in a thickness of 0.2 $\mu$m. Thus, the total length of each conductive path was about 50 $\mu$m (=thickness of ACF). The distance from one conductive path to the adjoining one as measured from the center line was 36 $\mu$m. The elastic modulus of the structure as a whole of this ACF was 0.2 GPa at 25° C. and 0.05 GPa at 150° C.

Sample 4 for Comparison

The basic structure and production process were the same as in Sample 1. The elastic modulus of this ACF was 1.5 GPa, which was outside the range of ACF to be used in the present invention.

The insulating material was a polyamide resin, the conductive path had a diameter of 30 $\mu$m, the thickness of the film substrate was 80 $\mu$m, and the amount of the copper wire protruding from each side of the film was 20 $\mu$m. The protrusion was gold plated in a thickness of 0.2 $\mu$m. Thus, the total length of each conductive path was about 120 $\mu$m (=thickness of ACF). The distance from one conductive path to the adjoining one as measured from the center line was 60 $\mu$m. The elastic modulus of the structure as a whole of this ACF was 1.5 GPa.

The semiconductor device for evaluation was as follows. Chip size 10 mm×10 mm, thickness 500 $\mu$m, electrode type: Au stud bump, electrode bump diameter 70 $\mu$m, bump height 70 $\mu$m, number of electrodes 156, center distance between electrodes 200 $\mu$m.

The circuit board for evaluation was as follows. Glass epoxy substrate (FR-4), total thickness (1 mm) including the thickness of circuit pattern, circuit width of circuit pattern : width of interval=100 $\mu$m:100 $\mu$m.

Evaluation Results

The required numbers of the semiconductor devices and circuit boards for the above-mentioned evaluation were prepared. The ACFs of the above-mentioned Samples 1 to 4 were used to connect the semiconductor devices and circuit boards. A contact load was applied and the minimum load necessary for contact of all the electrodes of the semiconductor device was measured and taken as a contact load per one electrode.

In the test using Sample 1, which is the ACF of the present invention, the contact load per one electrode was 20 gf when all contact points were continued, which contact load was preferable. The deformation amount of ACF at that time was 15 μm, and ACF well absorbed warp and waviness of the semiconductor device and circuit board. Consequently, the functional test was confirmed to be highly reliable.

In the test using Sample 2, the contact load per one electrode was 10 gf, which was preferable, and the deformation amount of ACF at that time was 7 μm. As in the case of Sample 1, warp and waviness of the semiconductor device and circuit board were absorbed well. Consequently, the functional test was confirmed to be highly reliable.

In the test using Sample 3 for comparison, the contact load per one electrode was 5 gf when all contact points were continued, and the deformation amount of ACF at that time was 6 μm. By setting the elastic modulus at 150° C. to 0.05 GPa, the film substrate of ACF adhered to the semiconductor device and circuit board in the test at 150° C. As a result, the film was not easily released and inapplicable to a functional test.

In the test using Sample 4 for comparison, the contact load per one electrode was 40 gf when all contact points were continued, due to the elastic modulus of ACF which was set to 1.5 GPa. As a result, many bump contacts formed as the electrodes of a semiconductor device deformed significantly to an impractical level for mounting, and the film was inapplicable to a functional test.

According to the test method and ACF of the present invention, a semiconductor device and a circuit board can be connected at every contact point with the minimum load. The electrodes on the device and the conductor on the circuit board are not damaged, and a highly reliable functional test is available in a temporal connection state.

This application is based on application No. 023128/1999 filed in Japan, the contents of which are incorporated hereinto by reference.

What is claimed is:

1. A method for performing a functional test of a semiconductor device, comprising the steps of
    (a) sandwiching an anisotropic conductive film between a semiconductor device and a circuit board for the test which permits functionally testable conduction between the device and the circuit board,
    (b) applying pressure to create a contact load of 3–50 gf per one electrode of the device to achieve functionally testable conduction between the device and the circuit board, wherein the anisotropic conductive film deforms by 5–30 μm due to the contact load, thereby absorbing warp and/or waviness in the device and/or the circuit board;
    (c) carrying out the functional test of the device; and
    (d) removing the device from the anisotropic conductive film;
        wherein the anisotropic conductive film comprises a film substrate having two major opposing surfaces and comprising an insulating resin; and plural conductive paths each having a total length of 60–500 μm, comprising a conductive material, which penetrate the film substrate in the thickness direction, which protrude from the two major opposing surfaces of the film substrate, and wherein each of said paths is insulated from each other of said paths; and wherein the film as a whole has an elastic modulus of 0.1–1.0 GPa at 25–150° C.

2. The method of claim 1, wherein at least the conductive paths in the film substrate are metal conductor wires having a diameter of 5–30 μm and the protrusion is either the metal conductor wire itself or a metal precipitated on an end of the metal conductor wire.

3. The method of claim 1, wherein in step (b), the contact load is from 5–15 gf per one electrode of the device.

4. A method for mounting a semiconductor device on a circuit board which minimizes damage to the electrodes of the device, while permitting performance of a functional test of the device, comprising the steps of
    (a) sandwiching an anisotropic conductive film between a semiconductor device and a circuit board which permits functionally testable conduction between the device and the circuit board;
    (b) applying pressure to create a contact load of 3–50 gf per one electrode of the device to achieve functionally testable conduction between the device and the board, wherein the anisotropic conductive film deforms by 5–30 μm due to the contact load, thereby absorbing warp and/or waviness in the device and/or the circuit board and minimizing damage to electrodes of the device; and
    (c) carrying out the functional test of the device;
        wherein the anisotropic conductive film comprises a film substrate having two major opposing surfaces and comprising an insulating resin; and plural conductive paths each having a total length of 60–500 μm, comprising a conductive material, which penetrate the film substrate in the thickness direction, which protrude from the two major opposing surfaces of the film substrate, and wherein each of said paths is insulated from each other of said paths; and wherein the film as a whole has an elastic modulus of 0.1–1.0 GPa at 25–150° C.

5. The method of claim 4, wherein at least the conductive paths in the film substrate are metal conductor wires having a diameter of 5–30 μm and the protrusion is either the metal conductor wire itself or a metal precipitated on an end of the metal conductor wire.

6. The method of claim 4, wherein in step (b), the contact load is from 5–15 gf per one electrode of the device.

* * * * *